United States Patent [19]

Roselle et al.

[11] Patent Number: 5,340,438
[45] Date of Patent: Aug. 23, 1994

[54] LOW TEMPERATURE INSITU IMAGE REVERSAL PROCESS FOR MICROELECTRIC FABRICATION

[75] Inventors: Paul L. Roselle, Webster; Stephen L. Kosman, Rochester, both of N.Y.

[73] Assignee: Eastman Kodak Company, Rochester, N.Y.

[21] Appl. No.: 73,211

[22] Filed: Jun. 7, 1993

[51] Int. Cl.$^5$ ............... H01L 21/306; B44C 1/22; C03C 15/00; C03C 25/06
[52] U.S. Cl. .................... 156/643; 156/657; 156/662; 156/667; 156/904; 156/659.1
[58] Field of Search ............... 156/643, 650, 656, 657, 156/662, 667, 904, 659.1

[56] References Cited

U.S. PATENT DOCUMENTS

| | | | |
|---|---|---|---|
| 4,613,402 | 9/1993 | Losee et al. | 156/643 |
| 5,032,221 | 7/1991 | Roselle et al. | 156/643 |
| 5,102,498 | 4/1992 | Itoh et al. | 156/659.1 |
| 5,171,401 | 12/1992 | Roselle | 156/643 |
| 5,240,554 | 8/1993 | Hori et al. | 156/643 |

Primary Examiner—William Powell
Attorney, Agent, or Firm—Raymond L. Owens

[57] ABSTRACT

An insitu image reversal process which uses a sacrificial coating of indium tin oxide and simultaneously deposits amorphous carbon in openings patterned in the ITO while removing the deposited ITO to expose the underlying coating, thereby completing image reversal.

1 Claim, 3 Drawing Sheets

LOW TEMPERATURE INSITU IMAGE REVERSAL PROCESS FOR MICROELECTRIC FABRICATION

FIELD OF THE INVENTION

The present invention relates to an image reversal process.

BACKGROUND OF THE INVENTION

The use of image reversal in microelectronic fabrication has been widely used for applications where self-alignment of a gate electrode to an underlying implant is needed. This is particularly the case for the process of commonly assigned U.S. Pat. No. 4,613,402 issued Sep. 23, 1986 to Losee et al entitled "Method of Making Edge-Aligned Implants and Electrodes Therefor". Common image reversal processes rely on the use of an oxidizable layer such as polysilicon to achieve a reversed image. A patterned layer of silicon nitride residing on a polysilicon layer provides openings which expose the surface of the polysilicon layer. By oxidizing the surface of the exposed polysilicon one can reverse the image of the nitride onto the polysilicon. This is done by etching off the nitride and patterning the polysilicon using the oxidized surface of the polysilicon as an etch mask. The resultant pattern in the polysilicon gate is the reversed image of the originally patterned nitride layer. Key disadvantages to such a process include the high temperature needed to oxidize the surface of the polysilicon and the many process steps needed to exact a result.

SUMMARY OF THE INVENTION

It is the object of this invention to provide a new method for image reversal which overcomes the above problems.

In accordance with this invention, an insitu image reversal process comprises the steps of:

a) forming a patterned deposited layer of indium tin oxide (ITO) on a coating to be patterned provided on a substrate such as silicon;

b) simultaneously depositing amorphous carbon on the coating in the patterned ITO while removing the deposited ITO to expose the coating under the ITO; and c) etching the exposed portions of the coating with an etch that is selective to the amorphous carbon to thereby complete the reversal process.

ADVANTAGES

We have quite unexpectedly discovered a low temperature insitu image reversal process utilizing ITO and a methane based plasma etch of ITO. The methane based plasma etching of ITO produces volatile indium and tin species that leave the surface of the ITO layer that is exposed to the plasma. Materials other than ITO (such as silicon dioxide used as a mask for the ITO etching) have a carbon film deposited on them during exposure to the ITO plasma etch. This combination of etching of ITO with the simultaneous deposition of amorphous carbon on other materials exposed simultaneously to the ITO plasma etch is the basis for this image reversal process.

BRIEF DESCRIPTION OF THE INVENTION

FIG. i is a schematic, in partial crosssection, of a conventional plasma etcher which uses radio frequency energy to ignite and sustain the plasma; and FIGS. 2-6 show various steps in an image reversal process in accordance with this invention.

DESCRIPTION OF THE PREFERRED EMBODIMENTS

Figure 1:
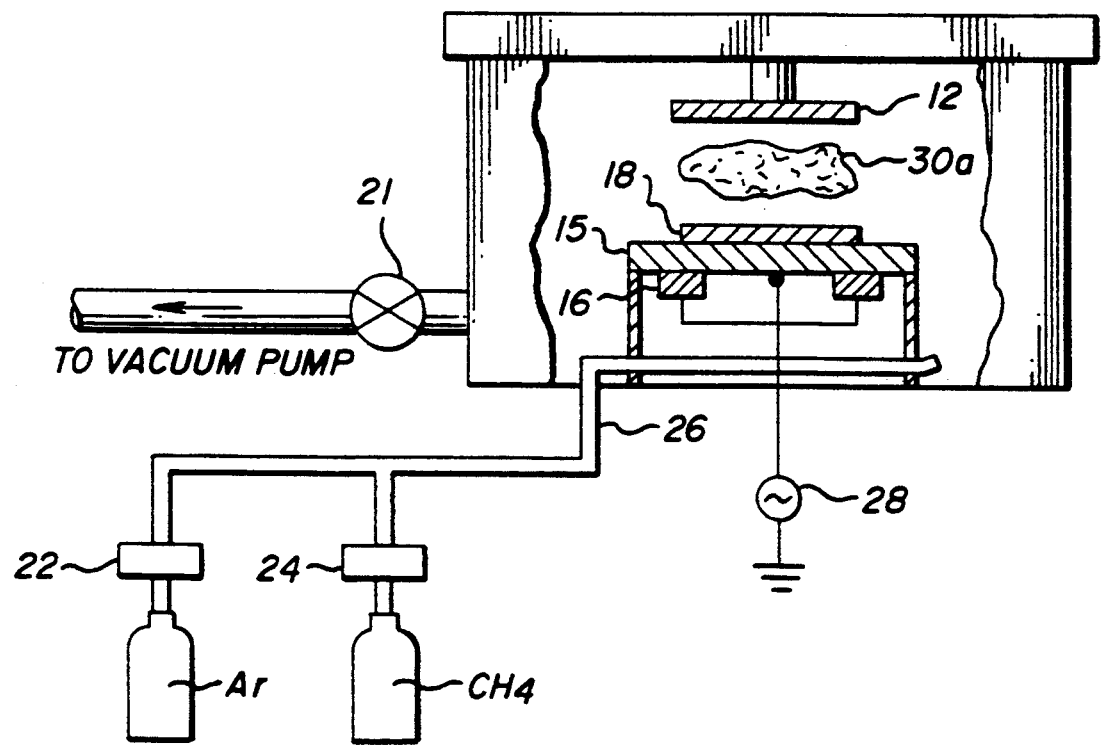

A process for image reversal using indium tin oxide is described and can use the plasma etcher of FIG. 1.

A plasma is a state of matter in which the gases in a vessel with a total pressure less than atmospheric pressure are partially ionized by an electric field. As is well understood, such an electric field can be from a radio frequency generator, microwave frequency generator or DC voltage field.

A plasma, ignited by the action of such an electric field on a mixture of $CH_4$ gas and Ar gas, will contain methyl radicals ($CH_3 \cdot$) as well as other species generated from the cracking of the molecules of $CH_4$. As in any plasma, the concentration of the various species in the plasma depend upon the power and frequency of the electric field applied, the pressure of the plasma, and the concentrations of the gases used. It should be understood that $CH_4$ and Ar mixtures are not the only means of producing methyl radicals ($CH_3 \cdot$) and that mixtures of ethane and Ar, propane and Ar, or other organic compounds will result in methyl radical creation in plasma and will, in doing so, etch ITO.

Figure 2:
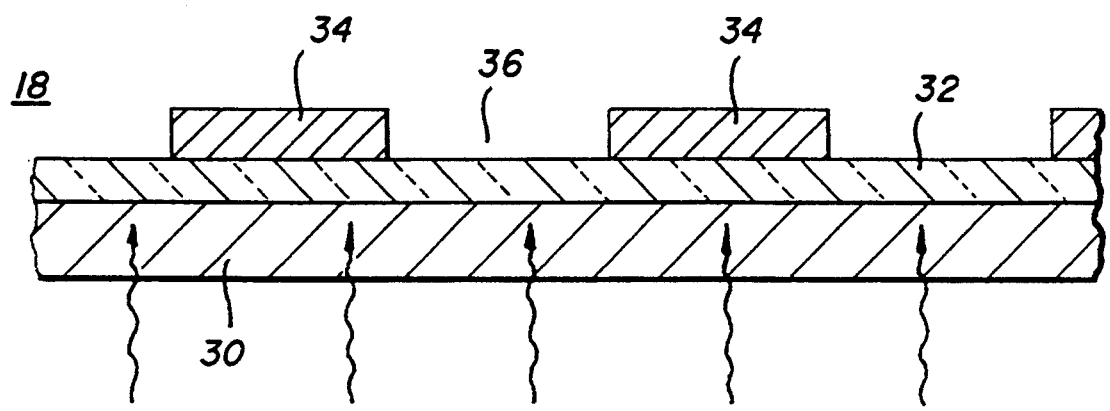

For an etcher as represented in FIG. 1, a wafer 18 (see FIG. 2) is placed on a lower electrode 15 of the etcher which is connected to an RF radiation source 28. A layer 32 (See FIG. 2) of a dielectric material to be patterned such as silicon dioxide or polycrystalline silicon is deposited on the substrate 30 of the wafer 18 by well known techniques such as chemical vapor deposition (CVD) techniques. A layer 34 of ITO is provided on the layer 32. This layer can be deposited by sputtered deposition and then patterned by a number of techniques to provide window openings 36 to the layer 32 as shown in FIG. 2. The openings can be formed by providing a mask on the ITO layer 32 and then etched in a device such as shown in FIG. 1. For a more complete discussion of this process, see commonly assigned U.S. Pat. No. 5,032,221 issued Jul. 16, 1991 to Roselle et al entitled "Etching Indium Tin Oxide" and U.S. Pat. No. 5,171,401 issued Dec. 15, 1992 to Paul L. Roselle entitled "Plasma Etching Indium tin Oxide", the teachings of which are incorporated herein by reference.

Figure 3:
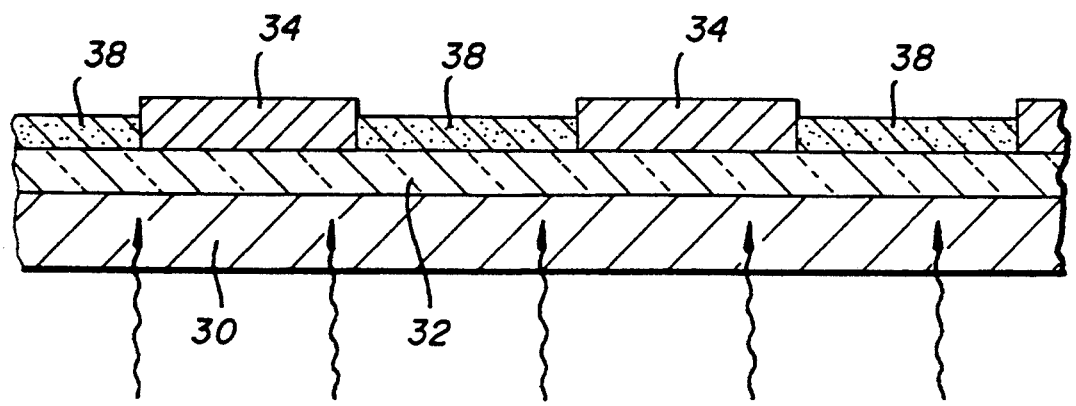

Alternatively, the ITO layer can have the windows formed by well known wet etching techniques. Vacuum is achieved in the chamber by the use of an oil diffusion pump and rotary vacuum pump, not shown. The lower electrode 15 is heated by resistive heaters 16 located on the back of the electrode. The Ar and $CH_4$ gases are admitted into the chamber through a diffuser 26. The flows of the gases are regulated by mass flow controllers 22 and 24. Process pressure in the vessel is controlled by a vacuum throttle valve 21. When the desired flow rates, pressure and temperature are achieved, a plasma of $CH_4$ and Ar is ignited and in a region 30a between the lower electrode 15, on which the wafer 18 sits, and an upper electrode 12. The resultant $CH_3 \cdot$ generated in the region 30a will react with the ITO on the wafer 18 volatilizing the ITO off the wafer to be pumped away by the vacuum pump. The pressure of the plasma of $CH_4$ and Ar must be maintained below the polymerization point of the plasma. Likewise, the ratio of $CH_4$ to Ar should be less than 20% to prevent excessive polymerization of the species in the plasma. Such excessive polymerization produced by too high of a pressure and/or too high of a concentration of $CH_4$ in Ar will prevent ITO from etching. In this process as shown in FIG. 3 ITO is etched and, at the same time (simultaneously), amorphous carbon is deposited in the openings 36 to provide a reversal image mask 38 in each of the openings.

Figure 4:
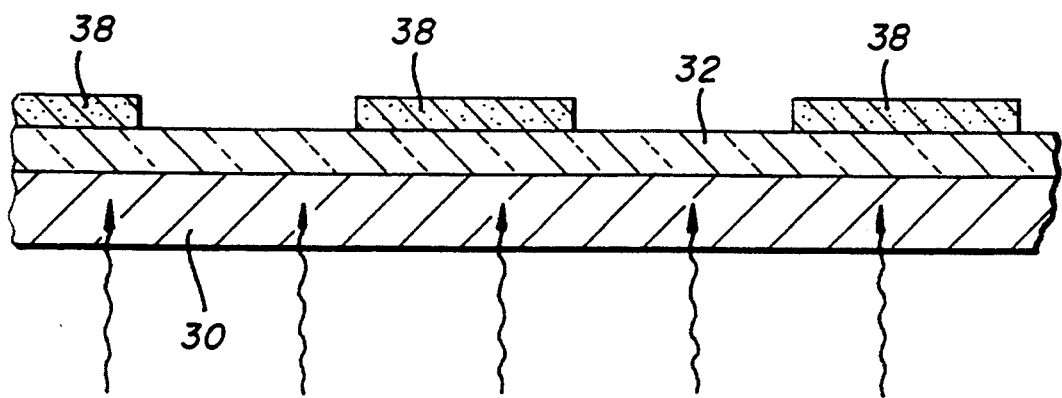
Figure 5:
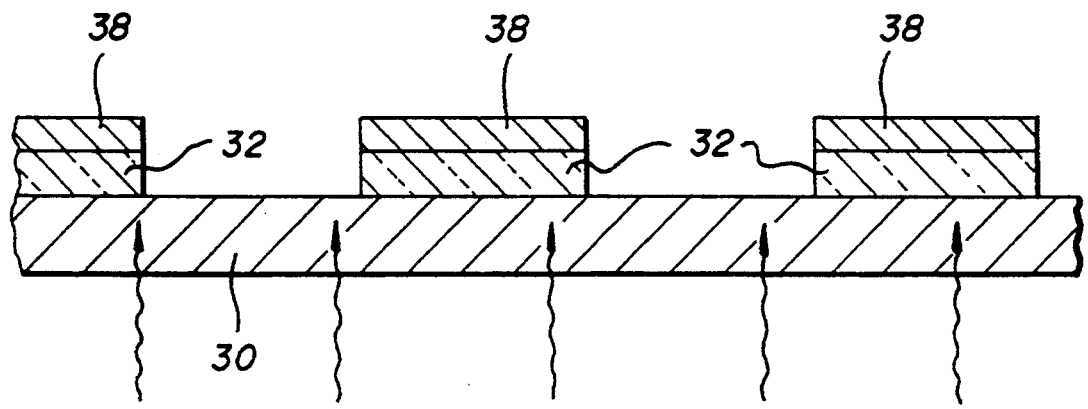
Figure 6:
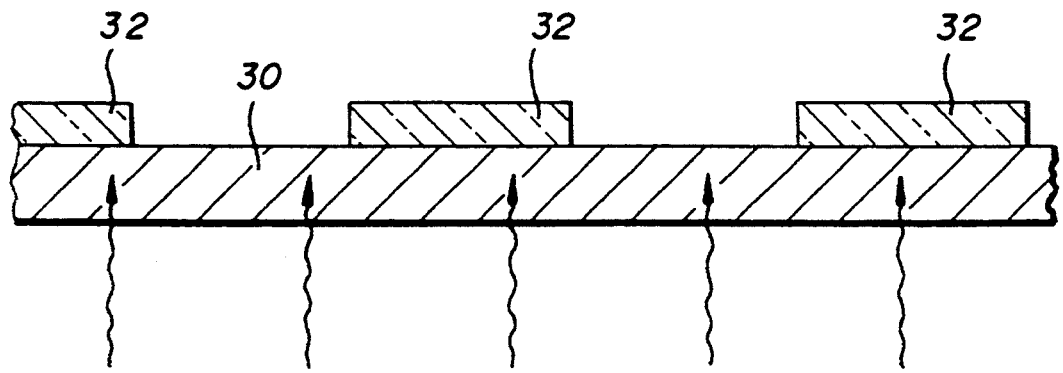

As shown in FIG. 4, the process continues until the ITO is etched away exposing the layer 32 leaving reversal image mask 38 of amorphous carbon. The wafer 18 is removed from the chamber. The layer 32 to be patterned is etched in a process which is selective to the α-carbon layer 38. If layer 32 were polysilicon, for example, a common plasma etch using $SF_6$ would transfer the α-carbon image into the polysilicon while being selective to the α-carbon mask 38. Finally, the α-carbon mask 38 is removed by common oxygen ashing technique. This leaves the material 32 patterned with an image reversed from the original ITO patterned image 34.

The invention has been described in detail with particular reference to certain preferred embodiments thereof, but it will be understood that variations and modifications can be effected within the spirit and scope of the invention.

PARTS LIST 12 upper electrode
15 lower electrode
16 resistive heaters
18 wafer
21 throttle valve
22 flow controller
24 flow controller
26 diffuser
28 radiation source
30 substrate
30a a region
32 dielectric layer
34 ITO layer
36 openings
38 mask

What is claimed is:

1. An insitu microelectronic image reversal process comprising the steps of:
   a) forming a patterned deposited layer of indium tin oxide (ITO) on a coating to be patterned provided on a substrate;
   b) simultaneously depositing amorphous carbon on the coating in the patterned ITO while removing the deposited ITO to expose the coating under the ITO; and
   c) etching the exposed portions of the coating with an etch that is selective to the amorphous carbon to thereby complete the reversal process.

* * * * *